United States Patent
Belouet et al.

(10) Patent No.: US 8,410,352 B2
(45) Date of Patent: Apr. 2, 2013

(54) METHOD OF FABRICATING PHOTOVOLTAIC CELLS

(75) Inventors: Christian Belouet, Sceaux (FR); Claude Remy, Limonest (FR)

(73) Assignee: Solarforce, Bourgoin Jallieu (FR)

( * ) Notice: Subject to any disclaimer, the term of this patent is extended or adjusted under 35 U.S.C. 154(b) by 421 days.

(21) Appl. No.: 11/792,327

(22) PCT Filed: Dec. 8, 2005

(86) PCT No.: PCT/EP2005/056621
§ 371 (c)(1), (2), (4) Date: Jun. 4, 2007

(87) PCT Pub. No.: WO2006/067051
PCT Pub. Date: Jun. 29, 2006

(65) Prior Publication Data
US 2008/0210299 A1    Sep. 4, 2008

(30) Foreign Application Priority Data
Dec. 21, 2004 (FR) ..................................... 04 53127

(51) Int. Cl.
H01L 31/00 (2006.01)
H01L 21/00 (2006.01)

(52) U.S. Cl. .............. 136/256; 438/57; 438/59; 438/63; 438/501

(58) Field of Classification Search .................. 136/256; 438/57, 59, 63, 501
See application file for complete search history.

(56) References Cited

U.S. PATENT DOCUMENTS

| | | | | |
|---|---|---|---|---|
| 4,113,532 A | | 9/1978 | Authier et al. | 148/174 |
| 4,383,130 A | * | 5/1983 | Uroshevich | 136/261 |
| 4,478,880 A | | 10/1984 | Belouet | 427/86 |
| 4,616,595 A | | 10/1986 | Belouet et al. | 118/405 |
| 4,663,828 A | * | 5/1987 | Hanak | 438/62 |
| 4,705,659 A | * | 11/1987 | Bernstein et al. | 264/29.6 |
| 5,609,912 A | * | 3/1997 | Lackey et al. | 427/212 |
| 6,217,649 B1 | | 4/2001 | Wallace, Jr. et al. | 117/47 |
| 6,998,288 B1 | * | 2/2006 | Smith et al. | 438/48 |

FOREIGN PATENT DOCUMENTS

| | | |
|---|---|---|
| DE | 19525720 | 1/1997 |
| EP | 0079567 | 5/1983 |

OTHER PUBLICATIONS

International Search Report—Mar. 15, 2006. XP008051287.

* cited by examiner

Primary Examiner — Kevin P Kerns
Assistant Examiner — Steven Ha
(74) Attorney, Agent, or Firm — Sofer & Haroun, LLP

(57) ABSTRACT

The invention relates to a method of fabricating photovoltaic cells in which at least one layer of semiconductor material is deposited continuously on a carbon ribbon (10) to form a composite ribbon (20), said layer having a free face (22, 24) opposite from its face in contact with the carbon ribbon. According to the invention, at least one treatment (28) is applied to the layer of semiconductor material, from said free face (22, 24), in order to implement photovoltaic functions of the cells on said layer, prior to eliminating the carbon ribbon (10). The invention makes it possible to increase productivity in the fabrication of photovoltaic cells, which cells can be of very small thicknesses.

27 Claims, 1 Drawing Sheet

METHOD OF FABRICATING PHOTOVOLTAIC CELLS

RELATED APPLICATIONS

This application is a National Phase application of PCT/EP2005/056621, filed on Dec. 8, 2005, which in turn claims the benefit of priority from French Patent Application No. 04 53127, filed on Dec. 21, 2004, the entirety of which are incorporated herein by reference

FIELD OF THE INVENTION

The present invention provides a method of fabricating photovoltaic cells on ribbons or strips of semiconductor material, in particular of silicon.

BACKGROUND OF THE INVENTION

In order to fabricate photovoltaic cells on a larger scale, and in particular for solar panels, one solution consists in using a composite ribbon made up of a carbon ribbon covered on both faces in respective layers of polycrystalline silicon. The carbon ribbon passes continuously through a bath of molten silicon, preferably vertically. On leaving the bath, both faces of the ribbon are covered in a relatively thin layer of silicon. This produces a composite silicon-carbon-silicon ribbon. This method is known as RST (Ribbon on Sacrificial Template) and is described in various patents, e.g. FR 2 386 359, FR 2 550 965, and FR 2 568 490. It can be used to obtain layers of silicon having thickness that is as small as 50 micrometers ($\mu m$). Nevertheless, such thin layers are fragile and therefore difficult to handle. That is why the layers as fabricated in this way generally have thicknesses that are greater than 150 $\mu m$.

The composite ribbons are cut into composite plates of small size (e.g. 12.5 centimeters (cm) by 12.5 cm). These plates are then heated in a gas containing oxygen to a temperature close to 1000° C. in order to burn off the carbon ribbon. This operation, referred to as "burning off" is described for example in patent FR 2 529 189. Starting from each composite plate, this produces two thin plates of silicon having the same dimensions as the composite plates, i.e. small dimensions. Thereafter, the silicon plates are subjected to various treatments leading to the implementation of photovoltaic cells, these treatments differing depending on the type of cell that is to be fabricated. In general, after burn-off, the front and rear faces are deoxidized, junctions are formed by diffusing a precursor over at least one of the faces, an ant reflection layer is deposited on the front face, and electric contacts are deposited.

That plate fabrication method is a discontinuous method, well suited to fabricating plates of small dimensions that are relatively thick (thicknesses greater than 150 $\mu m$), and it can be incorporated well in present technology for fabricating photovoltaic cells made from plates of crystalline silicon.

Nevertheless, in order to make it economically attractive to obtain photovoltaic electricity by using the crystalline silicon technique, it is desirable to provide photovoltaic cells that are very thin (thicknesses lying in the range 30 $\mu m$ to 100 $\mu m$) and that present high photovoltaic conversion efficiency.

In this context, the above method is confronted with the critical problem of manipulating thin plates having thickness of less than 150 $\mu m$. The multiple manipulation operations that are performed on such plates of large dimensions that are fragile because they are thin and that present high levels of residual stress, and that are performed at high rates of throughput (more than 1000 units per hour), lead to greatly reduced fabrication yield.

OBJECTS AND SUMMARY OF THE INVENTION

The present invention proposes a method of fabricating photovoltaic cells that enables fabrication cost to be diminished, that enables the fabrication yield of cells to be increased, and that enables cells to be obtained that are of great length. The method is particularly advantageous for implementing cells of very small thickness, lying in the range 30 $\mu m$ to 100 $\mu m$, but it is also applicable to thicknesses that are greater.

More precisely, the invention relates to a method of fabricating photovoltaic cells in which at least one layer of semiconductor material is deposited continuously on a carbon ribbon to form a composite ribbon, said layer having a free face opposite from its face in contact with the carbon ribbon. In the method, at least one treatment is applied to the layer of semiconductor material, from its free face, in order to implement photovoltaic functions of said cells prior to eliminating the carbon ribbon.

In an implementation, the treatment comprises creating a plurality of contact zones (forming the bases of the cells) by depositing a precursor material on said free face, which face constitutes the rear face of said cells, said precursor material including dopant elements, e.g. boron or phosphorous, that conserve the type of the doping, n or A, of said semiconductor material.

In another implementation, the treatment comprises creating a plurality of junction zones (to form the emitters of the cells) by depositing a precursor material on the free face, which face constitutes the rear face of said cells, the precursor material including dopant elements, e.g. boron or phosphorous, that change the doping type of the semiconductor material. The treatment may comprise creating a plurality of zones to insulate said contact zones (the bases) electrically from said junction zones (the emitters), e.g. by depositing an oxidizing material on the free face.

In another implementation, the treatment comprises creating a plurality of junction zones by depositing a precursor material on the free face, which face constitutes the front face of said cells, said precursor material including dopant elements, e.g. boron or phosphorous, that change the doping type of the semiconductor material.

In another implementation, the treatment includes piercing holes, e.g. by laser, in the layer of semiconductor material, substantially perpendicularly to said free face, the holes passing through the layer of semiconductor material.

In another implementation, the treatment includes ablating the semiconductor material covering the flanks of the composite ribbon, e.g. by laser ablation, by laser ablation assisted by water jet, or by plasma cleaning.

The carbon ribbon is preferably eliminated by being burnt off, after performing at least one of the above-mentioned treatments. The dopants may be diffused from said precursor material into the semiconductor material during the burn-off of the carbon ribbon.

All or some of the above-mentioned treatments may be performed continuously. Alternatively, the composite ribbon may be cut up to form composite strips of great length, with the treatment(s) being applied to said composite strips (i.e. prior to eliminating the carbon ribbon). By way of example, the length of said composite strips may lie in the range 1.0 meter (m) to 4.50 m.

In an implementation of the method, strips of semiconductor material of great length are obtained by eliminating the carbon from the composite strips cut out from the composite ribbon, and at least one of the following operations is performed on said strips of semiconductor material: texturing the front faces of the photovoltaic cells; implementing junction zones; depositing an antireflection layer on the front faces of the cells; depositing electric contacts on the front and rear faces of the cells.

The semiconductor material is preferably silicon. By way of example, the precursor is based on an oxide filled with boron (sometimes with additional aluminum) if it is desired to increase p-type doping, or filled with phosphorous if it is desired to increase n-type doping. The composite ribbon is advantageously fabricated by the RST (Ribbon on Sacrificial Template) method, the ribbon advantageously having two layers of semiconductor material on either side of the carbon ribbon, each of the two layers of semiconductor material having a free face to which the treatment(s) is/or applied.

BRIEF DESCRIPTION OF THE DRAWINGS

Other advantages and characteristics of the invention appear from the following description of a plurality of implementations, given as non-limiting examples, and with reference to the drawing in which FIG. 1 (the sole FIGURE) is a diagram showing variant implementations of the invention.

DETAILED DESCRIPTION

Figure 1:
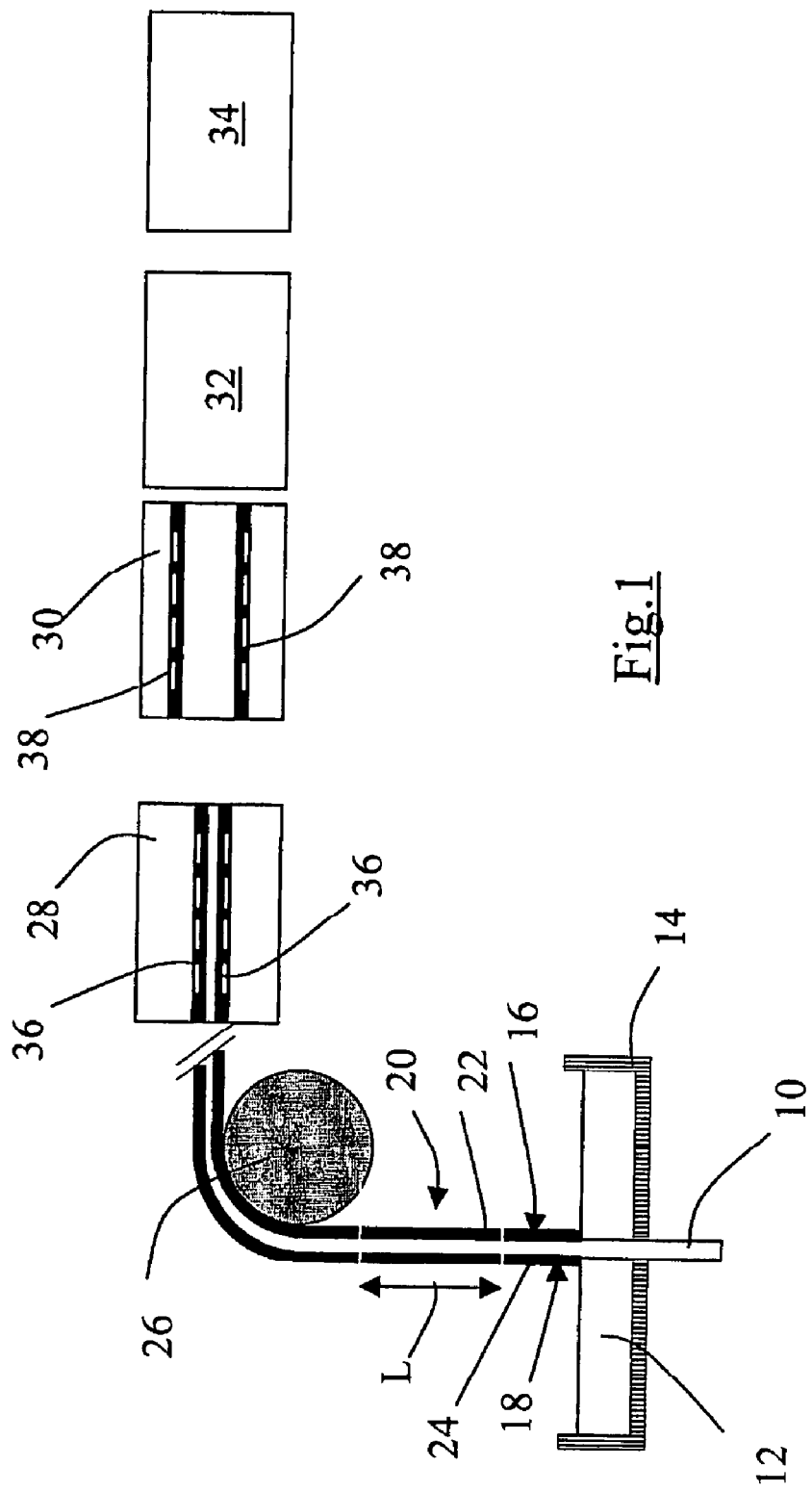

The implementation shown in FIG. 1 makes use of the RST (Ribbon on Sacrificial Template) method of obtaining thin plates of polycrystalline silicon of thickness lying in the range 250 µm to 50 µm. In this method, a carbon ribbon 10 that is approximately 220 µm thick and 12.5 cm wide travels continuously vertically through a bath of molten silicon 12 contained in a drawing structure 14. At the surface of the bath, where the carbon ribbon leaves the bath of silicon, two layers 16 and 18 of polycrystalline silicon become deposited on and adhere to the two faces of the carbon ribbon 10. The thickness of the layers of silicon depends in particular on the travel speed of the ribbon through the bath, with thickness decreasing as speed increases. By way of example, it is possible to obtain thicknesses that are less than or equal to 80 µm for a travel speed close to 10 centimeters per minute (cm/min). At the outlet from the bath, a composite ribbon 20 is obtained that is made up of two thin layers 16 and 18 of silicon surrounding the carbon ribbon. The layer 16 has one face in contact with the carbon ribbon 10 and an opposite face 22 that is said to be a "free" face. Similarly, the layer 18 has one face in contact with the carbon ribbon 10 and an opposite face 24 constituting a "free" face.

In the present invention, one or more treatments are applied directly to the composite ribbon, before separating the layers of silicon from the carbon ribbon, the treatments acting from the free faces 22, 24 of each of the two layers of silicon. On leaving the drawing structure 14, the composite ribbon (silicon-carbon-silicon) is thus no longer cut up into individual plates, that would then subsequently be treated individually in order to make photovoltaic cells. On the contrary, in the invention, as many as possible of the operations needed for producing the final photovoltaic cell are performed on the composite ribbon 20 or on composite strips of great length, taking advantage of the support provided by the carbon ribbon.

There are two possible variant implementations of the invention on leaving the drawing structure.

In a first variant, the treatments are performed continuously on the composite ribbon, putting a maximum number of operations in line up to the stage of eliminating the carbon ribbon. At the outlet from the drawing structure 14, the composite ribbon 20 is deflected through 90° by means of a roller 26 so as to pass from the vertical position to a horizontal position. This variant is possible only if the composite ribbon 20 is sufficiently flexible to be capable of being deflected without suffering damage, and thus if the thickness of the silicon layers is small, e.g. less than or equal to 100 µm.

Nevertheless, prior to bending the ribbon, this variant implies eliminating the deposit of silicon from the flanks of the composite ribbon in order to reduce the radius of curvature of the ribbon to values that are acceptable in practice, e.g. less than about 0.5 m. This treatment may be performed by laser ablation, by laser ablation assisted by water jet, by plasma, or any other appropriate solution. Under all circumstances, the edge face of the carbon ribbon is laid bare. This operation is also performed in other variant implementations, but it can be performed later on in the fabrication process, however it must be done at the latest before eliminating the carbon ribbon. The radius of curvature of the ribbon can be further decreased by applying a removable polymer film that adheres to the outside face of the ribbon (the face being stretched) over the entire curved length, and in particular in the vicinity of the cut edge face. After being deflected, the composite ribbon is delivered to a chamber 28 where it is subjected to various treatments on a continuous basis.

In a second variant implementation, the composite ribbon is cut up into strips 36 of great length L, typically lying in the range 1.0 m to 4.5 m. This variant is well suited to larger thicknesses of silicon, typically greater than 100 µM to 150 µm, and in particular for thicknesses that are close to 200 µm. This variant implementation is also selected when the optimum treatment speeds from one treatment station to another are not mutually compatible, or would involve a loss of overall productivity for the method. The composite strips 36, possibly coming from a plurality of drawing structures 14 operating in parallel, are then placed in the chamber 28 in order to be treated therein.

In the chamber 28, the silicon layers of the composite ribbon 20 or the composite strips 36 of great length L are subjected to one or more conventional treatments acting via their free faces 22 and 24, in order to implement photovoltaic functions for cells, prior to eliminating the carbon ribbon. The free faces will constitute the front or rear faces of the cells depending on the treatment(s) applied. The purpose of these treatments is to create junction zones and/or contact zones and/or zones for electrically insulating the previously-mentioned zones. The junction and contact zones are made, for example, out of a precursor material carrying doping elements that are deposited on determined locations of the free faces. Holes can also be pierced by laser through the layers of silicon, going right through the layers, in order to provide electrical connections between junction zones on the front face and junction zones on the rear face of a photovoltaic cell, when the cells that are to be made are of the metallization wrap through (MWT) type and/or in order to improve the following step of eliminating the carbon ribbon. The holes are made before creating the junction zones.

It should be observed that during these treatments, the carbon ribbon acts as a support and also as a diffusion barrier.

The following operation consists in simultaneously eliminating the carbon ribbon and diffusing the dopant(s) from the precursor(s) into the semiconductor material. To do this, the composite ribbon 20 penetrates continuously into an open oven 30. Alternatively, it may be cut up at the exit from the chamber 28 into composite strips of great length, e.g. lying in the range 1.5 m to 4.5 m. These strips, and possibly also strips 36 coming from the chamber 28, are grouped together in the oven 30 in order to be subjected therein to bulk treatment, thereby reducing costs. The carbon ribbon is eliminated at high temperature (close to 1000° C.) by oxidation, starting from the flanks of the carbon ribbon (cleared of silicon deposit), and optionally from the through holes (already present for the MWT structures), with the ribbon moving continuously in translation through the oven 30. In this method of eliminating the carbon ribbon, the layers of silicon are separated in order to produce self-supporting silicon strips 38. The temperature profile in the burn-off oven 30, its length, and the speed of movement in translation of the composite ribbon 20 or of the composite strips 36 are optimized in order to optimize diffusion of the dopants in the metallic contact and junction zones deposited in the chamber 28, and in order to obtain burning of the carbon ribbon at a rate that is satisfactory. Under all circumstances, the width of the ribbon, the dopant composition of the diffusion precursor films, and the duration and the temperature of the burning off are independent parameters that are optimized in an overall context that takes account of the productivity of the method and the conversion efficiency of the photovoltaic cells.

After burn-off the silicon strips 38 are continuous elements (in the continuous method), e.g. about one hundred meters long, or else they are silicon strips that are several meters long. These strips are flexible and suitable for being wound and unwound for all subsequent operations that finish off the fabrication of photovoltaic cells. These operations are represented symbolically by a rectangle 32, and they are conventional and well known to the person skilled in the art. They are performed conventionally on plates of small dimensions whereas in the invention they are performed on strips of great length. They include deoxidizing the face of the silicon strip that is opposite from its free face (e.g. by using plasma at atmospheric pressure), making $n^+/p$ or $p^+/n$ junctions on said face by diffusion (for a conventional photovoltaic cell and also for MWT cells) and/or depositing a passivation layer of SiNx, depositing electric contacts (e.g. using ink-jet or silkscreen printing techniques), and final heat treatments.

The long silicon strips are subsequently cut up into individual photovoltaic cells of the desired dimensions (operation represented by rectangle 34). They may be of great length, up to the maximum of the length of the silicon strips. This cutting operation is performed only at the time they are put into modules.

Two examples of successive treatments are described below, assuming that the composite silicon-carbon-silicon ribbon 20 coming from the drawing structure 14 has been cut up into composite strips of great length L, e.g. close to 2 m.

EXAMPLE 1

This example relates to a conventional silicon photovoltaic cell structure comprising the following successive elements, starting from the front face and going towards the rear face of the cell: electrical contact; antireflection layer; junction or emitter layer ($n^+/p$ with p-doped silicon, or $p^+/n$ with n-doped silicon); silicon layer; rear contact zone or base (which is in fact a $p^+/p$ junction for p-doped silicon or $n^+/n$ junction for n-doped silicon); and electric contact. In general, for cells of this type, the above-defined contact zones are always placed on the rear face (base), and have the same type of doping, n or p, as the silicon, and the junction zones are doped with the type opposite to the type of doping of the silicon. The thickness of such a structure is typically 200 μm.

On the two free faces of composite strips, forming the rear faces of photovoltaic cells, a precursor material is applied in order to form a plurality of contact zones. By way of example the precursor is based on a boron-filled oxide (sometimes including aluminum) if it is desired to increase p-type doping, or a phosphorous-filled oxide if it is desired to increase n-type doping. The silicon covering the flanks of the composite strips is removed by laser, either before or after depositing the precursor material. In order to facilitate the following steps of burning of the carbon, holes may optionally be pierced through the silicon layers.

Thereafter, the composite strips pass through an oven for the purposes firstly of eliminating the carbon ribbon by burning it off, thus obtaining long strips of silicon, and secondly of diffusing the dopant from the precursor into the silicon in order to create the $p^+/p$ or $n^+/n$ contacts.

Thereafter, gas diffusion or a precursor filled with phosphorous or boron is used to create a plurality of $n^+/p$ or $p^+/n$ junctions on the long strips of silicon on the faces that are to be the front faces of the cells, which faces have previously been deoxidized (by plasma treatment at atmospheric pressure, for example). The front and rear faces are deoxidized, and an antireflection layer is deposited on the front face, the electric contacts are deposited on the front and rear faces (e.g. by ink-jet or silkscreen printing), the contacts are annealed, the strips are cut to the desired dimensions (laser cutting or partial cutting following by cleaving), and the cells are encapsulated.

EXAMPLE 2

This example relates to a photovoltaic cell structure of the MWT type that is well adapted to silicon in small thicknesses, e.g. less than 200 μm. On its front face, this structure has not only an antireflection layer, but also narrow conductive lines deposited on n+/p junction zones (cell emitter) if the silicon is of the p type, and $p^+/n$ junction zones if the silicon is of the n type. On the rear face of the cells, junction zones identical to the junctions on the front face alternate with $p^+/p$ contact zones (analogous to those of the base of a conventional cell) if the silicon is of p type, and $n^+/n$ contact zones if the silicon is of n type. The junction zones and the contact zones, referred to as emitters and bases are separated by electrically insulating zones or "trenches" (oxidized zones). Through holes having walls doped like the junction zones of the front faces of the cells provide electrical connection between the junctions on the front face and the junctions on the rear face. It is the rear face junctions that are used as the electric contacts of the emitter after being brought through to the rear face via the through holes.

On the free faces of the composite strips, that are to become the rear faces of the cells, a precursor material based on boron oxide is deposited in order to create the $p^+/p$ contact zones of the base (when using p-type silicon), possibly over the entire free face. Thereafter, by laser ablation or by any other technique, the surface is cleaned so as to leave the precursor only at those locations where it is desired to create the base contact zones. Theater, an SiOx oxide film is deposited, e.g. over the entire free surface, including the previously cleaned zone. Within said zone, $n^+/p$ junction zones are subsequently made (repeating the emitter), together with insulating zones. For this purpose, in a second etching operation, e.g. by laser ablation or any other technique, the layer of SiOx is eliminated over a fraction only of the free surface that is to receive the $n^+/p$ junction zones (repeating the emitter). Thereafter, holes are pierced through the layers of silicon within said n⁺/p junction zones. The n⁺/p zones and the walls of the holes are then covered in a precursor material based on phosphorous oxide (n⁺), e.g. deposited by means of an aerosol. At this stage, the p⁺/p contact zones (covered in SiOx), the n⁺/p junction zones, and the zones covered by an SiOx layer insulating the contact zones and the junction zones have all been made. This technique for making the junction zones and the contact zones of the base is not exhaustive. Techniques for depositing precursors by silkscreen printing can also be applied. The silicon deposited on the edges of the composite strips is eliminated.

Thereafter, the carbon ribbon is burnt off in an oven, thus separating the two silicon layers of each composite strip. The high temperature also serves to cause the dopants to diffuse from the precursors into the silicon so as to finish off creating the junctions and the contacts. If the precursors were deposited by silkscreen printing, this step serves to oxidize and passivate the zones that physically separate the base and contact zones on the free faces. The following steps are then performed on silicon strips of great length.

The front faces of the cells (the faces that were facing the carbon) are deoxidized and possibly textured so as to increase the effectiveness of the cells. After making junction zones on this face, an antireflection layer is also deposited on the front face. The electric contacts are then made on the front face (emitter) and on the rear face (emitter repeat and base in alternation). The silicon strips fitted in this way are finally cut up to the dimensions desired for the photovoltaic cells and encapsulated.

The present invention procures numerous advantages. Firstly, the advantages due to the presence of the carbon ribbon in the composite ribbon are conserved:
  continuous deposition of a plane silicon film of thickness that can be adjusted in the range 300 µm to 50 µm on each of the opposite faces of the carbon substrate;
  the composite ribbon leaving the drawing structure is flexible, provided the thickness of the silicon films is small;
  the faces of the silicon films that are in contact with the carbon remain protected until these films are separated from the carbon ribbon; and
  it is easy to texture the surfaces of the films that were in contact with the carbon easily.

In addition, the invention reduces the cost of fabricating thin or thick photovoltaic cells by implementing a fabrication method that is continuous or quasi-continuous by using strips of great length, and that is suitable for automation, in contrast to the conventional method in which the various operations are performed on plates of small dimensions that need to be manipulated on numerous occasions. The fabrication yield of very thin photovoltaic cells is greater than with the conventional method, in particular because of the presence of the carbon ribbon that serves as a support for the treatments performed prior to the burning-off operation, since the support reduces the risk of breakage.

It is also possible to obtain photovoltaic cells that are of great length, matching the size of a photovoltaic module, that are flexible, and that have coplanar contacts on their rear faces. Such thin cells can optionally be curved. The photovoltaic conversion efficiency of the cells is high, compared with that of conventional cells, because of the small thickness of the silicon layers and because of the possibility of fabricating interdigitated back contact (IBC) type cells with their contacts interleaved and carried through to the rear faces (so the front faces of the cells not having any electric contact, so the entire area of the front surface is used for receiving incident light).

The embodiments described make use of composite ribbons obtained by the RST (Ribbon on Sacrificial Template) method. It is clear to the person skilled in the art firstly that it is possible to deposit a single layer only of silicon on the carbon ribbon, and secondly that other methods could optionally be used such as vapor deposition enabling an (optionally continuous) thin layer of silicon to be obtained that is of great length (e.g. 30 cm) and deposited on a substrate, such as a carbon ribbon, that can be eliminated easily. Similarly, the examples given relate to thin layers of silicon. Horizontal drawing on a carbon substrate from a molten bath is another example of a method that can be used for depositing a layer of silicon that is relatively thick (200 µm or more) on a single face. Other semiconductor materials can be used without going beyond the ambit of the present invention, insofar as they can be obtained in the form of thin layers of large dimensions and that they give rise to a photovoltaic effect.

The invention claimed is:

1. A method of fabricating photovoltaic cells, said method comprising the steps of:
  fabricating a composite ribbon by depositing two layers of semiconductor material continuously and respectively on the two faces of a carbon ribbon to support said two layers, so that said two layers of semiconductor material surround said carbon ribbon after the carbon ribbon, as such, passes through a bath of molten semiconductor material, each of the two layers of semiconductor material having a free face on which a treatment is able to be applied;
  prior to eliminating said carbon ribbon, eliminating a deposit of semiconductor material from flanks of said composite ribbon in a sufficient way to lay bare the edge faces of said carbon ribbon, so that flanks of the carbon ribbon are cleared of the deposit of semiconductor material;
  eliminating the carbon ribbon during said method by burning off the carbon ribbon by oxidation from the flanks of the carbon ribbon cleared of the deposit of semiconductor material;
  applying at least one treatment to said free face of at least one of said layers of semiconductor material, in order to implement photovoltaic functions of said cells on said layer, prior to eliminating the carbon ribbon.

2. A method according to claim 1, wherein said at least one treatment comprises creating a plurality of contact zones by depositing a precursor material on said free face of at least one of said layers of semiconductor material, which face is the rear face of said cells, said precursor material including dopant elements that conserve the type of a doping, n or p of said semiconductor material.

3. A method according to claim 2, wherein said at least one treatment comprises creating a plurality of junction zones by depositing a precursor material on said free face of at least one of said layers of semiconductor material, which is the rear face of said cells, said precursor material including dopant elements that change the type of a doping of the semiconductor material.

4. A method according to claim 3, wherein said at least one treatment comprises creating a plurality of zones that insulate said contact zones electrically from said junction zones.

5. A method according to claim 4, wherein said zones that insulate are created by depositing an oxidizing material on said free face of at least one of said layers of semiconductor material.

6. A method according to claim 1, wherein said at least one treatment comprises creating a plurality of junction zones by depositing a precursor material on said free face of at least one of said layers of semiconductor material, which is the front face of said cells, said precursor material including dopant elements that change the type of a doping of the semiconductor material.

7. A method according to claim 1, wherein said at least one treatment comprises piercing holes in said layer of semiconductor material, substantially perpendicularly to said free face of at least one of said layers of semiconductor material, said holes passing through said layer of semiconductor material.

8. A method according to claim 7, wherein said piercing is performed by laser.

9. A method according to claim 1, wherein said step of eliminating the deposit of semiconductor material comprises ablating the deposit of semiconductor material covering the flanks of said composite ribbon.

10. A method according to claim 9, wherein said deposit of semiconductor material is removed by one of the following methods: laser ablation; laser ablation assisted by water jet; plasma ablation.

11. A method according to claim 1, wherein the diffusion of dopant(s) of a precursor into said semiconductor material is implemented during the burning off of said carbon ribbon, so that said carbon ribbon acts as a support and as a diffusion barrier.

12. A method according to claim 1, wherein said at least one treatment is performed continuously.

13. A method according to claim 1, wherein said composite ribbon is cut up to form composite strips of great length, said at least one treatment being applied to said composite strips.

14. A method according to claim 13, wherein strips of semiconductor material of great length are obtained by eliminating the carbon from said composite strips, and in that at least one of the following operations is performed on said strips of semiconductor material: texturing the front faces of the photovoltaic cells; implementing junction zones; depositing an antireflection layer on the front faces of the cells; depositing electric contacts on the front and rear faces of the cells.

15. A method according to claim 13, wherein said strips are of a length tying in the range 1.0 m to 4.50 m.

16. A method according to claim 1, wherein said semiconductor material is silicon.

17. A method according to claim 2, wherein said precursor material is based on an oxide filled with boron if it is desired to increase p-type doping or filled with phosphorous if it is desired to increase n-type doping.

18. A method according to claim 1, wherein said carbon ribbon passes vertically through a bath of molten semiconductor material.

19. A method according to claim 1, said method further comprising the step of applying at least one operation on another face of the at least one of said layers of semiconductor material that is opposite from said free face, after the carbon ribbon has been eliminated.

20. A method according to claim 1, wherein the composite ribbon is only composed of carbon and semiconductor material.

21. A method according to claim 1, wherein the treatment is performed continuously on the composite ribbon.

22. A method according to claim 21, wherein the thickness of the semiconductor material is less than or equal to 100 μm.

23. A method according to claim 13, wherein the thickness of the layers of semiconductor material is substantially 100 μm-200 μm.

24. A method according to claim 1, wherein the thickness of the layers of semiconductor material is substantially between 250 μm, and 30 μm.

25. A method according to claim 1, wherein the presence of the carbon ribbon serves as a support for the at least one treatment performed prior to the burning-off operation, so that the support reduces the risk of breakage of the semiconductor material during the application of said treatment.

26. A method according to claim 1, wherein the deposit of semiconductor material from flanks of said composite ribbon is eliminated in order to reduce the radius of curvature of the ribbon to a value less than about 0.5 m.

27. A method according to claim 1, wherein the deposit of semiconductor material is removed by one of the following methods: laser ablation; laser ablation assisted by water jet; plasma ablation.

* * * * *

UNITED STATES PATENT AND TRADEMARK OFFICE
CERTIFICATE OF CORRECTION

PATENT NO. : 8,410,352 B2
APPLICATION NO. : 11/792327
DATED : April 2, 2013
INVENTOR(S) : Belouet et al.

Page 1 of 1

It is certified that error appears in the above-identified patent and that said Letters Patent is hereby corrected as shown below:

In the Claims:

Column 8, Claim 1, Line 28: The word "haying" between the word "material" and "a" should be "having"

Column 9, Claim 15, Line 41: The word "tying" between the word "length" and "in" should be "lying"

Signed and Sealed this
Sixth Day of August, 2013

Teresa Stanek Rea
*Acting Director of the United States Patent and Trademark Office*